United States Patent [19]

Matsuzawa et al.

[11] Patent Number: 5,121,002
[45] Date of Patent: Jun. 9, 1992

[54] DYNAMIC LOGIC GATES

[75] Inventors: Akira Matsuzawa, Neyagawa; Shota Nakashima, Osaka; Haruyasu Yamada, Hirakata, all of Japan

[73] Assignee: Matsushita Electric Industrial Co., Ltd., Osaka, Japan

[21] Appl. No.: 324,038

[22] Filed: Mar. 14, 1989

[30] Foreign Application Priority Data

Mar. 14, 1988 [JP] Japan .................. 63-59719

[51] Int. Cl.⁵ .................. H03K 19/003; H03K 19/01; H03K 19/092; H03K 19/094
[52] U.S. Cl. .................. 307/446; 307/570; 307/475; 307/542; 307/544
[58] Field of Search .............. 307/446, 570, 475, 450, 307/571, 279, 443, 542, 568, 558, 264, 544

[56] References Cited

U.S. PATENT DOCUMENTS

| | | | |
|---|---|---|---|
| 4,661,723 | 4/1987 | Masuda et al. | 307/446 |
| 4,713,796 | 12/1987 | Ogiue et al. | 307/446 X |
| 4,740,718 | 4/1988 | Matsui | 307/446 |
| 4,808,850 | 2/1989 | Masuda et al. | 307/446 |
| 4,849,658 | 7/1989 | Iwamura et al. | 307/446 |

Primary Examiner—Stanley D. Miller
Assistant Examiner—David R. Bertelson
Attorney, Agent, or Firm—Wenderoth, Lind & Ponack

[57] ABSTRACT

A dynamic logic gate includes a precharge device for precharging the logic gate in synchronism with a clock; a partial logic gate arranged such that, depending on the logic states of the logic inputs, current in allowed to flow between its two terminals or is cut off; a bipolar transistor whose emitter is grounded, and a discharge device for discharging the charge stored in the base of the bipolar transistor during the precharge period. The logic gate speeds up the logic operation by suddenly discharging the load capacity of the circuitry by supplying the conducting current of the partial logic gate to the bipolar transistor base and using the high speed current amplification action of the bipolar transistor.

1 Claim, 6 Drawing Sheets

DYNAMIC LOGIC GATES

BACKGROUND OF THE INVENTION

This invention relates to dynamic logic gates.

Figure 1:
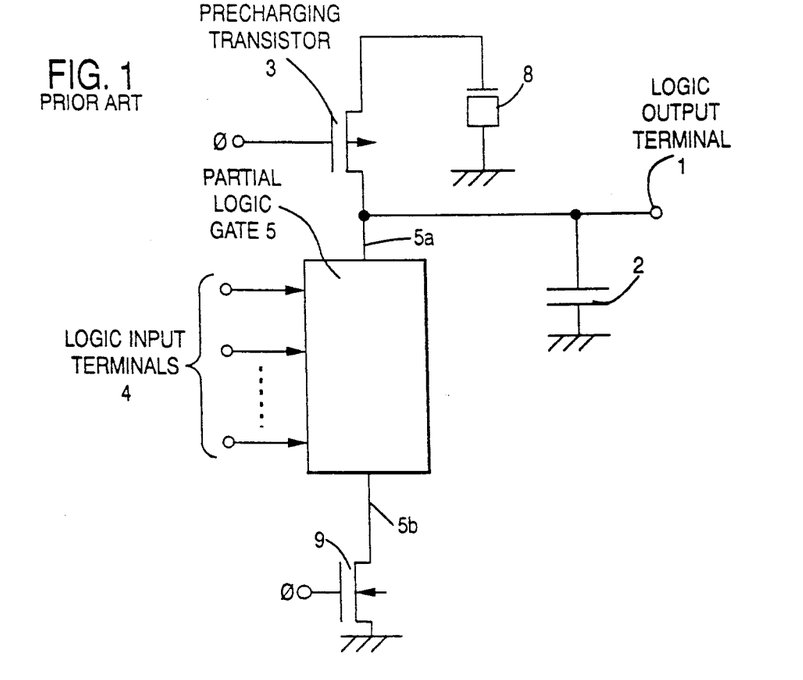
FIG. 1 is a circuit diagram of a conventional dynamic logic gate.

FIG. 1 shows a typical dynamic logic gate in which MOS transistors are used.

In FIG. 1, element 1 is a logic output terminal; element 2 is a capacitor; element 3 is a precharging transistor; elements 4 are logic input terminals; element 5 is a partial logic gate where the current between its two output terminals 5a and 5b is allowed to flow or is cut off according to the status of the logic inputs; element 9 is a transistor that cuts off the current from the logic gate during the clock precharge period and conducts during other clock periods, and element 8 is a power supply.

Figure 2:
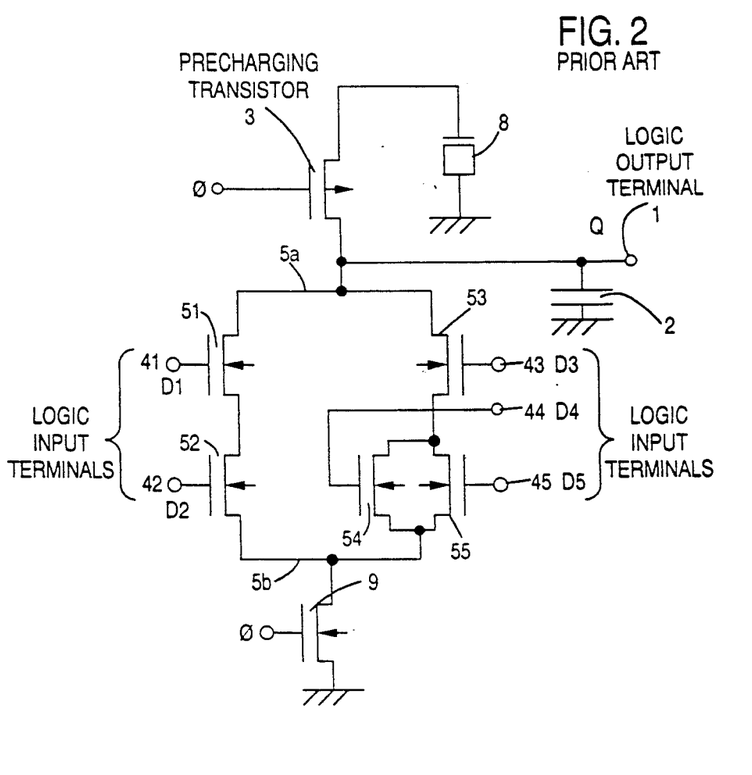
FIG. 2 is a more detailed circuit diagram of a conventional dynamic logic gate.

FIG. 2 shows the circuit of FIG. 1 with the partial logic gate 5 shown in more specific detail. In FIG. 2 elements 41-45 are logic input terminals for logic inputs $D_1$-$D_5$; elements 51-55 are transistors composing the logic gate. A current can flow between the terminals 5a and 5b when the logic inputs $D_1$-$D_5$ satisfy the following equation (1).

$$D_1 \cdot D_2 + D_3 \cdot (D_4 + D_5) = 1 \tag{1}$$

The circuit of FIGS. 1 and 2 operates in the following sequence. First, when the clock $\emptyset$ is a "0", the transistor 3 is "on", and the transistor 9 is "off". In this state, current flows from the power supply 8 to the capacitor 2 through transistor 3, and the capacitor 2 voltage rises, and the state of the logic output terminal 1 becomes "1" regardless of the state of the logic inputs $D_1$-$D_5$. Next, as the clock phase changes and the clock $\emptyset$ becomes a "1", the transistor 3 turns "off", and the transistor 9 turns "on". In this state, if the two terminals 5a and 5b of the partial logic gate 5 are in a state which allows current to flow therebetween, the charge stored in the capacitor 2 is discharged through the two terminals 5a and 5b as well as transistor 9, and the state of the logic output terminal 1 becomes a "0". On the other hand, if the partial logic gate 5 is in a state such that the current between the two terminals 5a and 5b is cut off, a discharge path is not formed, and the state of the logic output terminal 1 remains a "1".

In other words, the logic output generates normal values only when the clock $\emptyset$ is a "1", at which time the logic output Q is expressed by the following equation (2).

$$Q = D_1 \cdot D_2 + D_3 \cdot (D_4 + D_5) \tag{2}$$

Dynamic logic gates such as these are frequently used because of the advantage that no steady-state operating current flows, but they are operated at low power and, as the number of inputs increases, the circuit does not become too complex; whereas, in the case of an ordinary CMOS static logic gate, the circuit becomes complex.

However, there were shortcomings in that when the dynamic gates were used in a decoder or an ROM circuit, the capacitor 2 value reached several PF and the channel width was reduced in the partial logic gates. Consequently, the load driving capability decreased so as to increase the gate delay time.

SUMMMARY OF THE INVENTION

The object of this invention is to produce dynamic logic gates which can be operated at a high speed.

In order to achieve the above object, the dynamic logic gates of this invention include a logic output terminal, a capacitor connected to the logic output terminal, a precharge device that operates in synchronism with a clock and precharges the capacitor to a prescribed voltage level during one half of the clock cycle, a partial logic gate with at least one logic input terminal wherein the current between its two output terminals is allowed to flow or is cut off depending on the state of the at least one logic input and wherein one of these two output terminals is connected to the logic output terminal, a bipolar transistor whose emitter is grounded and whose collector is connected to the logic output terminal, and whose base is connected to the other of the two output terminals of the logic circuit, and a discharge device for discharging the charge stored in the base of the bipolar transistor.

According to the above-mentioned configuration of this invention, the current flowing to the partial logic gate becomes the base current of the bipolar transistor, and the bipolar transistor amplifies the current and rapidly discharges the charge on the capacitor using the amplified current, whereby the output terminal voltage rapidly trails off. Since the partial logic gate is connected between the base and collector of the bipolar transistor, when the collector. voltage decreases, the current flowing to the base is reduced. When the voltage between the base and collector becomes zero, the base current is zero, and saturation of the bipolar transistor is prevented, which makes high-speed logic operations possible.

DETAILED DESCRIPTION OF THE INVENTION

Figure 3:
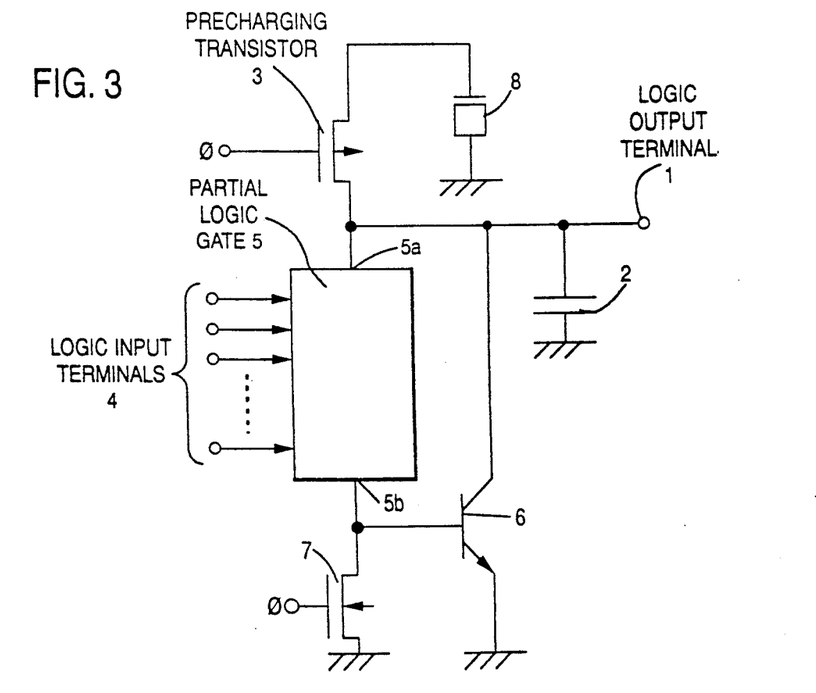
FIG. 3 is a circuit diagram of a dynamic logic gate in accordance with a first embodiment of this invention.

FIG. 3 shows a first embodiment in accordance with this invention. In FIG. 3 element 1 is a logic output terminal; element 2 is a capacitor: element 3 is a precharging transistor; elements 4 are logic input terminals; element 5 is a partial logic gate; element 6 is a bipolar transistor; element 7 is a transistor which operates as a discharge device for discharging the charge stored in the base of the bipolar transistor, and element 8 is a power supply.

First, with the clock $\phi$ at "0", the transistors 3 and 7 are turned "on". The transistor 6 is cut-off due to the low voltage between its base and its emitter, and no collector current flows. If the current flowing between the two terminals 5a and 5b of the partial logic gate 5 is either cut off or at a much lower value than the precharge current of the transistor 3, precharging occurs, and the capacitor 2 is charged and the logic output becomes a "1". When the clock $\phi$ is switched to a "1", the transistors 3 and 7 turn "off", and if the two terminals 5a and 5b of the partial logic gate 5 are conducting current, the current flowing between the two terminals become the base current of the bipolar transistor 6, and the amplified base current becomes the collector current and rapidly discharges the capacitor 2. This is a salient feature of this invention and causes the logic output to be generated at a higher speed than is possible with a conventional type of gate. Incidentally, the capacitor 2 was not installed expressly, but it signifies an inherently formed capacitance, such as the parasitic capacitance of a transistor or a wiring capacitance.

Figure 4:
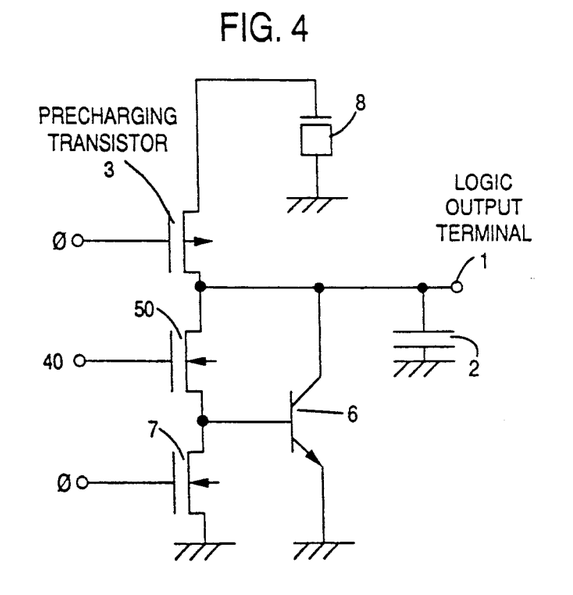
FIG. 4 is a more specific circuit diagram of the dynamic logic gate of FIG. 3.
Figure 5:
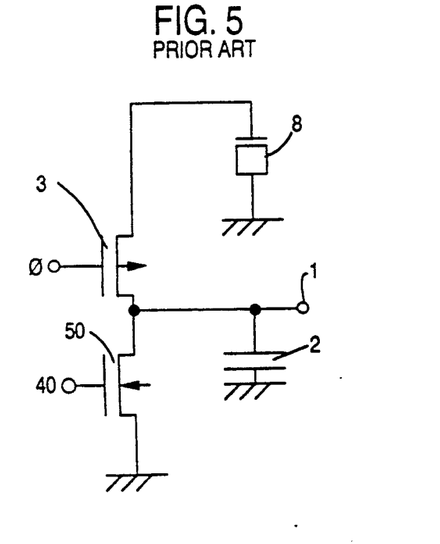
FIG. 5 is a circuit diagram of a conventional dynamic logic gate used for comparison with the first embodiment of this invention with respect to its effectiveness.

Next, the speed improvement is shown more specifically. In FIG. 4, the partial logic gate 5 as shown in FIG. 3 has been replaced by a specific MOS transistor 50. In order to simplify the following explanation, one input and one transistor are used. Since the precharge operation time is the same, the time for the logic-generating period is compared. First, a conventional circuit composed of MOS transistors alone is shown in FIG. 5, and the speed of this circuit is calculated. In FIG. 5, when the capacitance of the capacitor 2 is C and the voltage of the power supply 8 is Vhd CC, the voltage of the logic output terminal rises to $V_{CC}$ during the precharge period. If the clock $\phi$ is switched in this state, the charge on capacitor 2 is discharged by the transistor 50, and a logic output is obtained. If we assume the logic threshold to be $\frac{1}{2}V_{CC}$, the delay time $t_{pd}$ until a logic output is obtained is expressed by the following equation (3) denoting the discharge current as $I_d(t)$.

$$\frac{1}{2} CV_{CC} = \int_0^{t_{pd}} I_d(t)dt \tag{3}$$

$V_{CC}$ is impressed between the gate and the source of the MOS transistor 50, and if we assume that this transistor operates in a saturation region, the discharge current $I_d(t)$ is expressed by the following equation (4).

$$I_d = \frac{\beta}{2}(V_{gs} - V_t)^2 = \frac{\beta}{2}(V_{CC} - V_t)^2 \tag{4}$$

In equation (4), $\beta$ is a gain factor, $V_{gs}$ is the voltage between the gate and the source, and $V_t$ is the threshold voltage of the transistor.

From equations (3) and (4), the delay time $t_{pd}$ is expressed by the following equation (5).

$$t_{pd} = \frac{CV_{CC}}{\beta(V_{CC} - V_t)^2} \tag{5}$$

Next, as for the delay time in the examples of this invention, the base current $I_B$ of the bipolar transistor 6 is equal to the current drain of the MOS transistor 50, and considering the fact that the source potential of this transistor is higher than the ground potential by the voltage $V_{BE}$ between the base and the emitter of the bipolar transistor 6, the delay time can be expressed by the following equation (6).

$$I_B = \frac{\beta}{2}(V_{CC} - V_{BE} - V_T)^2 \tag{6}$$

In addition, the collector current $I_C$ can be approximated by the following equation (7).

$$I_C = h_{FE}I_B\left(1 - e^{-\frac{t}{\tau}}\right) \tag{7}$$

$$\tau = \frac{h_{FE}}{2\pi f_{Ti}}$$

Where $h_{FE}$ is the current amplification, and $f_{Ti}$ is the intrinsic cut-off frequency. Based on this, the following equation (8) will hold regarding the delay time $t_{pd}$.

$$\begin{aligned}\frac{1}{2}CV_{CC} &= \int_0^{t_{pd}}(I_B + I_C)dt \\ &= \int_0^{t_{pd}}\left\{(h_{FE}+1)I_B - h_{FE}I_B e^{-\frac{t}{\tau}}\right\}dt \\ \therefore \frac{1}{2}CV_{CC} &= (h_{FE}+1)I_Bt_{pd} + h_{FE}I_B\tau\left(e^{-\frac{t_{pd}}{\tau}} - 1\right)\end{aligned} \tag{8}$$

In equation (8), if we assume $$e^{-\frac{t_{pd}}{\tau}} - 1 \approx -\frac{t_{pd}}{\tau} + \frac{t_{pd}^2}{2\tau^2}$$

and approximate, $t_{pd}$ can be obtained from equation shown by the following equation (9).

$$t_{pd} \approx \sqrt{\frac{CV_{CC}}{2\pi f_{Ti}\cdot I_B}} = \sqrt{\frac{2CV_{CC}}{2\pi f_{Ti}\beta(V_{CC}-V_{BE}-V_T)^2}} \tag{9}$$

From equation (9) that gives the delay time in this invention and equation (5) that gives the delay time of a conventional circuit using a MOS transistor, we define a figure of merit K given by the following (10). K shows how much greater acceleration has been achieved by the circuit as compared to a conventional circuit.

$$K = \frac{\frac{CV_{CC}}{\beta(V_{CC} - V_T)^2}}{\sqrt{\frac{2CV_{CC}}{2\pi f_{Ti}\beta(V_{CC} - V_{BE} - V_T)^2}}} = \quad (10)$$

$$\frac{V_{CC} - V_{BE} - V_T}{(V_{CC} - V_T)^2} \cdot \sqrt{\frac{CV_{CC}\pi f_{Ti}}{\beta}}$$

In addition, the gain factor $\beta$ is expressed by the following equation (11).

$$\beta = \frac{\mu_O \cdot C_{OX}}{2}\left(\frac{W}{L}\right) \quad (11)$$

where $\mu_O$ is the carrier mobility, $C_{OX}$ is the unit capacity of the gate, W is the gate width, and L is the gate length. Next, if we assume $$V_{CC} = 5 \text{ V}, V_{BE} = V_T = 0.8 \text{ V}, f_{Ti} = 5 \text{ G Hz}.$$

$$\frac{\mu_O C_{OX}}{2} = 6 \times 10^{-6} \left(\frac{A}{V^2}\right)$$

equation (10, to the following equation (12).

$$K \approx 22 \sqrt{\frac{C}{\left(\frac{W}{L}\right)}}$$

Consequently, if the conditions of the following equation (13) holds, the delay time $t_{pd}$ of this invention would be smaller than that of a conventional circuit.

$$C \gtrsim \left(\frac{W}{L}\right) \times 2 \times 10^{-3} \quad (13)$$

(C is in PF)

If we assume W/L to be 10, the capacitance C is more than 20PF, and the delay time is smaller in this invention than in the conventional case. This means that the delay time is usually smaller in this invention than the conventional case.

Figure 6:
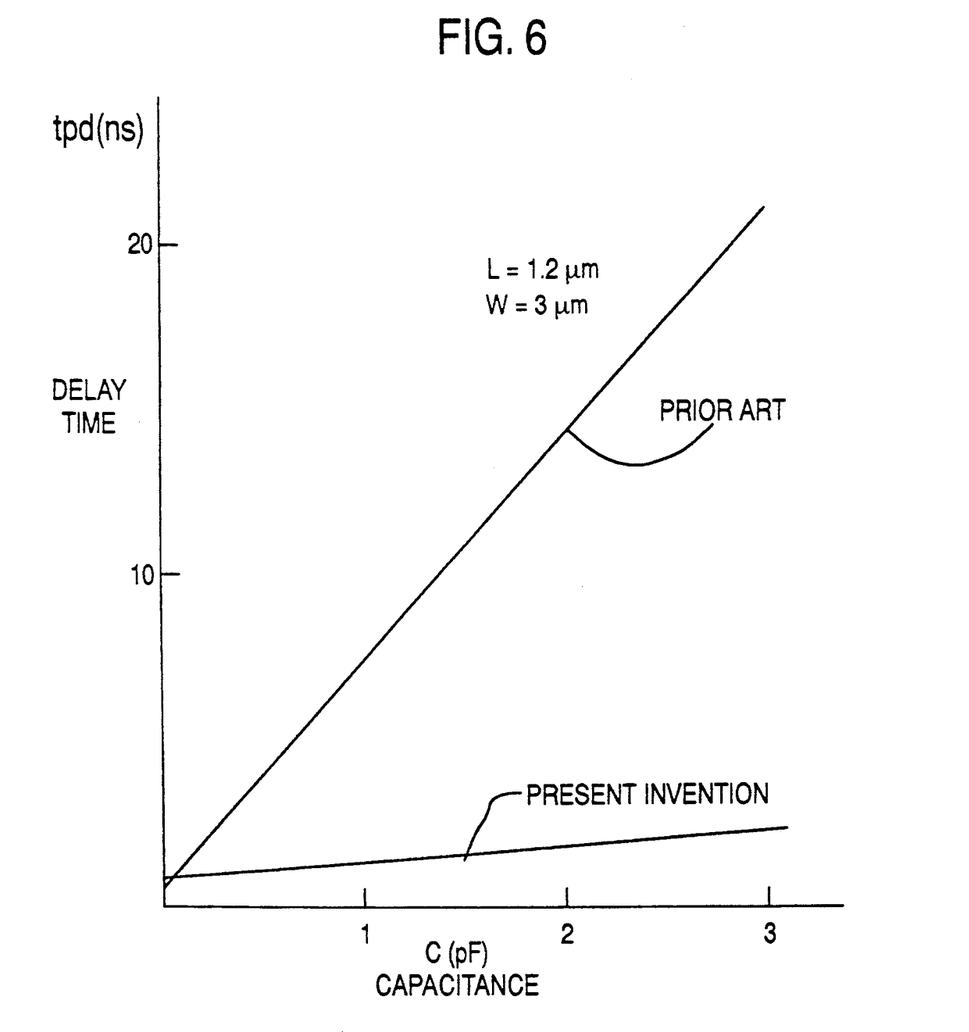
FIG. 6 is a characteristic diagram comparing dependency of the delay time on the load capacity of the dynamic logic gate of the first embodiment of this invention with a gate of the conventional type.

In FIG. 6, a simulation was performed using a computer. It shows the load capacity dependency of the delay times of this intention shown in FIG. 4 compared to the conventional case shown in FIG. 5. In most regions, the delay time of this invention is lower than that of the conventional case; at a capacitance of 3 PF, if it about ⅛ that of the conventional case. Consequently, when this invention is used, not only is a sharp increase in speed accomplished by a slight increase in the circuit scale, but less speed degradation occurs as compared to a conventional circuit even when the transistor channel width is reduced. Therefore, it is very effective for the reduction of LSI chip area. This is an important feature of this invention, and it is made possible for the first time by the high-speed nature of a bipolar transistor.

In addition, in the case of a circuit using bipolar transistors, the phenomenon of increased delay time is likely to occur due to transistor saturation. However, in the simulation, such a phenomenon does not occur. This is due to the fact that the MOS transistor 50 composing the partial logic gate 5 is connected to the bipolar transistor 6 between the base and the collector. When the collector voltage drops, the MOS transistor voltage between the drain and the source $V_{DS}$ drops, and the current flowing through the base decreases accordingly. When the voltage between the base and the collector becomes zero, the base current also becomes zero, and the collector-emitter voltage of the bipolar transistor 6 is maintained at about 0.6V at a minimum. Consequently, saturation of the bipolar transistors 6 does not occur, and high-speed logic operation is possible.

Figure 7:
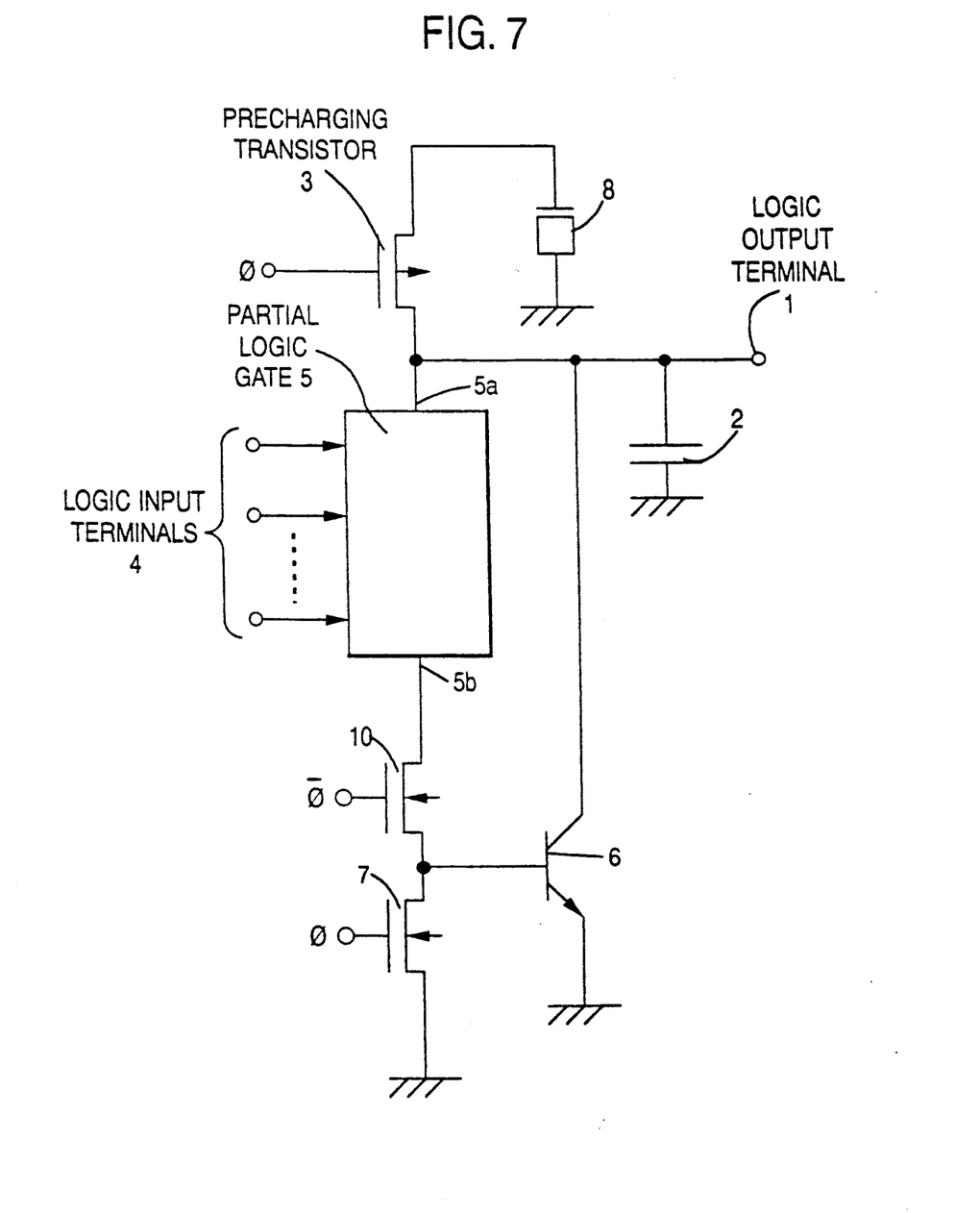
FIG. 7 is a circuit diagram of a dynamic logic gate in accordance with a second embodiment of this invention.

FIG. 7 is a dynamic logic gate of a second embodiment in accordance with this invention. As opposed to the first example, a transistor 10 is installed between the partial logic gate 5 and the bipolar transistor base and is as a switching device used to cut off the current between the partial logic gate 5 and the bipolar transistor base during the precharge period of the clock and to conduct curing other clock periods.

During the precharge period, since the clock ∅ becomes a "0" and the clock ∅ becomes a "1", the transistors 3 and 7 turn "on", and transistor 10 turns "off". Unlike the first example of this invention, it is not necessary to cut off the current flowing between the two terminals 5a and 5b of the partial logic gate 5 or to limit the current flowing to a value lower than the precharge current of the precharge transistor 3. An electric charge is stored in the capacitor 2 in this state, and the logic output becomes a "1". When the clock ∅ switches to a "1", the transistors 3 and 7 turn "off," and the transistor 10 turns "on". If the two terminals 5a and 5b of the partial logic gate 5 are conducting current, as in the first example of this invention, the current flowing between the two terminals 5a and 5b becomes the base current of the bipolar transistor 6, and the amplified base current becomes the collector current and rapidly discharges the capacitor 2. Therefore, a logic output is generated at a high speed.

Figure 8:
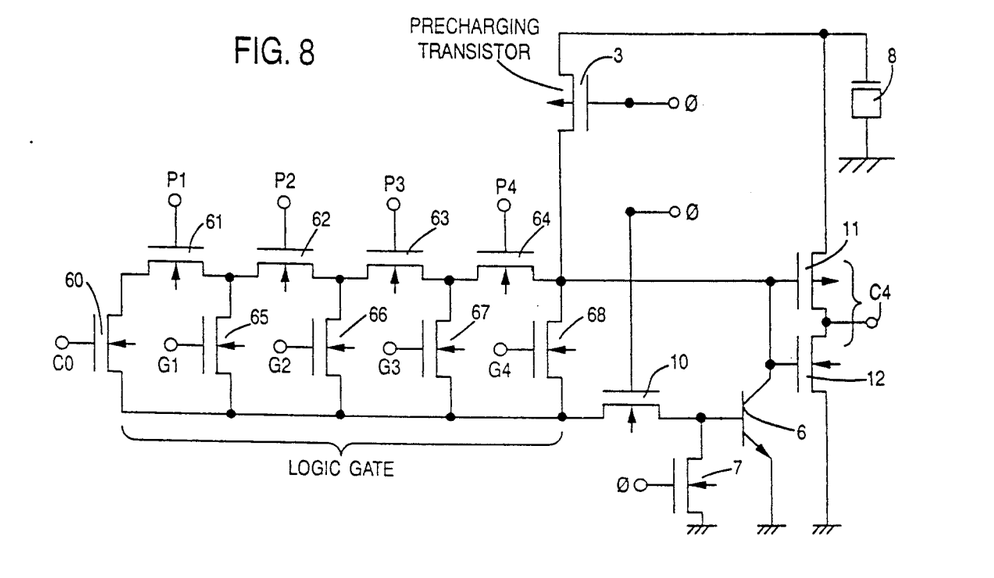
FIG. 8 is a circuit diagram of a carry look ahead circuit in accordance with a third embodiment of this invention.

FIG. 8 is a carry look ahead circuit, which is a third embodiment in accordance with this invention. A carry look ahead circuit is used in an adder-subtracter; FIG. 8 has a 4-bit configuration. The carry output $C_4$ of this circuit can be expressed by a logic expression as shown in the following equation (14) by means of a carry generating input Gi ($i=1-4$), a carry propagating input Pi ($i=1-4$), and a carry signal from the previous step $C_o$.

$$C_4 = G_4 + P_4 \cdot (G_3 + P_3 \cdot (G_2 + P_2 \cdot (G_1 + P_1 \cdot C_O))) \quad (14)$$

In addition, when a multiple-bit configuration is used, the logic gate is built as a cascade connection. In the third example of this invention, elements 60-68 satisfy the logic expression shown in equation (14). Transistors 11 and 12 composing the partial logic gate are transistors forming an inverter circuit installed to obtain positive logic outputs. The rest of the circuit of FIG. 8 is identical to the second embodiment in accordance with this invention as shown in FIG. 7. During the precharge period with the clock pulse ∅ inverts to a "1", the transistors 3 and 7 turn "off", and the transistor 10 turns "on". Therefore, when equation (14) is true, the base current of the transistor 6 flows, and the collector current of the transistor 6 rapidly removes out the precharged charge, thereby changing the inverter output $C_4$ to a "1".

Figure 9:
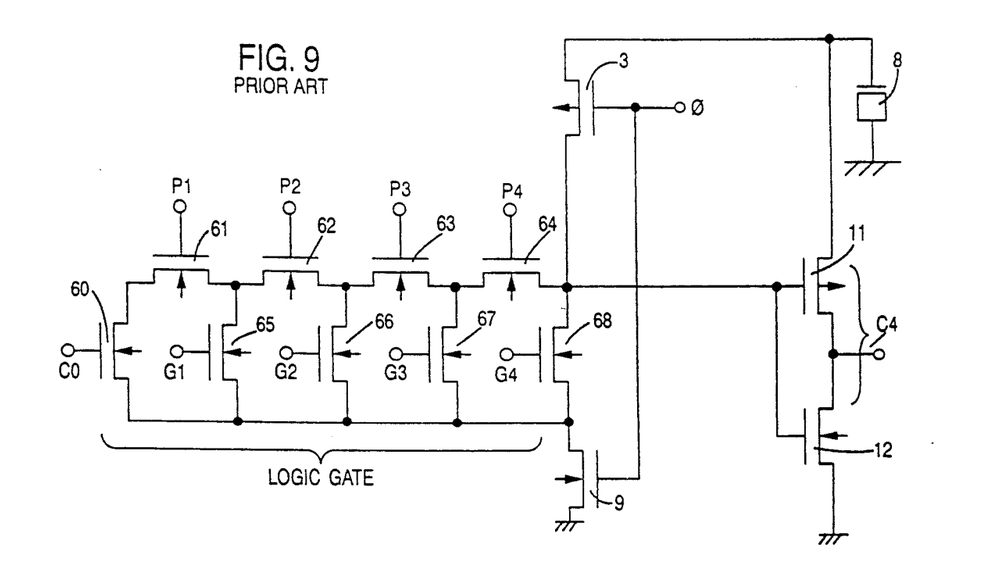
FIG. 9 is a circuit cia gram of a conventional carry look ahead circuit.

FIG. 9 shows a conventional carry look ahead circuit used for a performance evaluation of the third embodiment in accordance with this invention. The transistors 60–68 effecting equation (14) and the inverter circuit are identical to the third embodiment in accordance with this invention as shown in FIG. 8.

Figure 10:
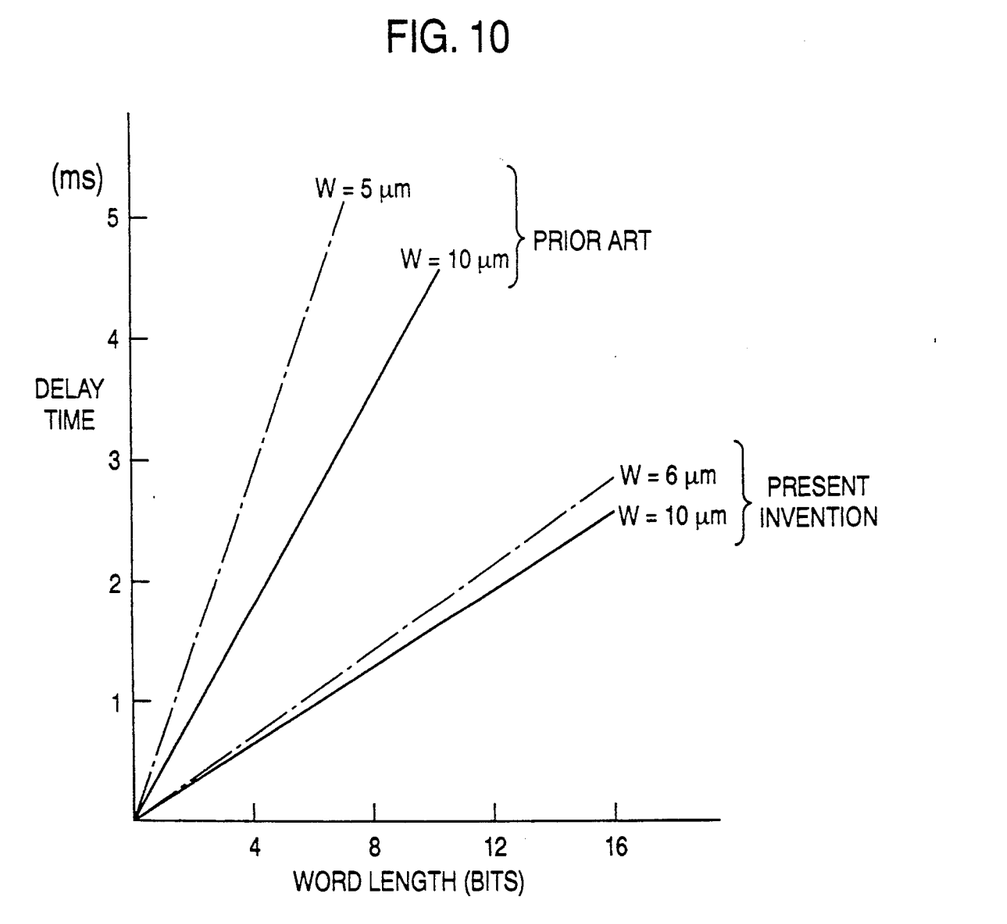
FIG. 10 is a characteristic diagram comparing delay characteristics of the data for a carry look ahead circuit of the third embodiment of this invention with a conventional carry look ahead circuit obtained by using the channel widths of the constituent MOS transistors as a parameter.

FIG. 10 compares the delay time with respect to word length of the carry look ahead circuit of this invention as shown in FIG. 8 with the conventional carry look ahead circuit as shown in FIG. 9 using the channel width W of the transistors 60–68 as a parameter. At a channel length of 1.2 $\mu m$, the speed increase was approximately 4-fold, and even at a channel width of 10 $\mu m$, it was as high as 2.7-fold. Consequently, the carry look ahead circuit of this invention is designed for a sharp increase in speed as compared to a conventional circuit, and it also has the advantage of building higher density circuits since speed does not decrease markedly even when the channel width of the transistor is small.

As described above, it is possible, with this invention, to build a high-speed logic circuit in a simple configuration by directing the current that flows through the partial logic gate to the base of a bipolar transistor, and using the current amplifying action to the bipolar transistor to rapidly discharge the capacitor charge with the collector of the transistor. For example, if applied to the carry look ahead circuit, it is possible to design a logic gate with a 2.70 to 4-fold increase in speed compared with the conventional logic gate configured only with CMOS devices. In addition, even with a reduced channel width of the MOS transistors composing the partial logic gate, speed is compromised less in this invention than in a conventional circuit, which enables designing at higher density and miniaturizing the circuit. Furthermore, since this invention does not specify a logic format for the partial logic gate, it is possible to apply it to specific logic gates such as a half adder, full adder, or decoder circuit, etc. or to a general logic gate such as a logical sum or logical product device, etc. In all cases, it is possible to design higher speed, higher density, and smaller circuits, and it has considerable industrial application.

We claim:

1. A dynamic logic gate comprising:
   a logic output terminal;
   a capacitor connected to said logic output terminal;
   a precharge means for receiving and operating synchronously with a clock to precharge said capacitor to a prescribed voltage level during a precharge period corresponding to one half cycle of said clock;
   a partial logic gate having logic inputs including a carry generating signal group, a carry propagating signal group, and a carry signal from a previous step and having first and second output terminals, wherein, according to a predetermined logic, current is allowed to flow between said first and second output terminals or is cut off, and wherein said first output terminal is connected to said logic output terminal;
   a bipolar transistor having an emitter which is grounded and having a collector which is connected to said logic output terminal and having a base;
   a switching means connected between said base and said second output terminal for cutting off the flow of current between said second output terminal and said base of said bipolar transistor during said precharge period of said clock, and for allowing the flow of current conducts during other periods of said clock; and
   a discharge means for discharging charge stored in said base of said bipolar transistor during said precharge period of said clock;
   wherein said partial logic gate generates carry inverse signals to a next step at said logic output terminal.

* * * * *